United States Patent
Tanaka et al.

(10) Patent No.: US 9,585,264 B2
(45) Date of Patent: Feb. 28, 2017

(54) PACKAGE FOR HOUSING SEMICONDUCTOR ELEMENT AND SEMICONDUCTOR DEVICE

(71) Applicant: KYOCERA Corporation, Kyoto-shi, Kyoto (JP)

(72) Inventors: Nobuyuki Tanaka, Kyoto (JP); Shigenori Takaya, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/409,324

(22) PCT Filed: Jun. 24, 2013

(86) PCT No.: PCT/JP2013/067174
§ 371 (c)(1),
(2) Date: Dec. 18, 2014

(87) PCT Pub. No.: WO2014/002921
PCT Pub. Date: Jan. 3, 2014

(65) Prior Publication Data
US 2015/0181728 A1    Jun. 25, 2015

(30) Foreign Application Priority Data
Jun. 26, 2012    (JP) ................................. 2012-143448

(51) Int. Cl.
*H05K 7/00*    (2006.01)
*H05K 5/02*    (2006.01)
(Continued)

(52) U.S. Cl.
CPC ............. *H05K 5/02* (2013.01); *G02B 6/4265* (2013.01); *G02B 6/4274* (2013.01);
(Continued)

(58) Field of Classification Search
CPC ... H01L 23/057; H01L 23/562; H01L 23/053; H01L 23/10; H05K 5/0247;
(Continued)

(56) References Cited

U.S. PATENT DOCUMENTS 4,577,056 A * 3/1986 Butt ...................... H01L 23/057
174/50.5
6,020,221 A * 2/2000 Lim ........................ H01L 23/04
257/E23.181
(Continued)

FOREIGN PATENT DOCUMENTS

JP    05-011443    *  2/1993
JP    5-11443 U       2/1993
(Continued)

OTHER PUBLICATIONS

International Search Report, PCT/JP2013/067174, Jul. 29, 2013, 2 pgs.

*Primary Examiner* — James Wu
(74) *Attorney, Agent, or Firm* — Volpe and Koenig, P.C.

(57) ABSTRACT

A package for housing a semiconductor element includes a base body including a bottom plate section and a frame-shaped side wall section; and an input/output terminal provided so as to pass through the side wall section, the input/output terminal having a plate section on which line conductors are formed, and a vertical wall section which is fixed to the plate section so as to continue to the side wall section and so that the line conductors are sandwiched between the plate section and the vertical wall section and both ends of the line conductors are exposed from the vertical wall section. The vertical wall section has a thick section in a center portion of a side surface of the vertical wall section in a direction along the side wall section, the
(Continued)

thick section having thick wall thickness, a lower end of the thick section being fixed to the plate section.

5 Claims, 4 Drawing Sheets

(51) Int. Cl.
| | | |
|---|---|---|
| *H01L 23/057* | (2006.01) | |
| *H01L 23/10* | (2006.01) | |
| *H05K 5/00* | (2006.01) | |
| *H01L 23/053* | (2006.01) | |
| *H01L 23/00* | (2006.01) | |
| *G02B 6/42* | (2006.01) | |
| *H01S 5/022* | (2006.01) | |

(52) U.S. Cl.
CPC ......... *H01L 23/057* (2013.01); *H05K 5/0095* (2013.01); *H05K 5/0247* (2013.01); *G02B 6/4201* (2013.01); *H01L 23/053* (2013.01); *H01L 23/10* (2013.01); *H01L 23/562* (2013.01); *H01L 2924/0002* (2013.01); *H01S 5/02216* (2013.01); *H05K 5/0091* (2013.01)

(58) Field of Classification Search
CPC ...... H05K 5/0091; H05K 5/0095; H05K 5/02; G02B 6/4201; G02B 6/4265; G02B 6/4274
USPC .................. 361/820; 174/520, 549, 50.5
See application file for complete search history.

(56) References Cited

U.S. PATENT DOCUMENTS

| | | | |
|---|---|---|---|
| 6,043,556 A * | 3/2000 | Tomie ................ | H01L 23/66 |
| | | | 257/664 |
| 2007/0069366 A1* | 3/2007 | Chang ................ | H01L 23/16 |
| | | | 257/700 |
| 2011/0048796 A1 | 3/2011 | Tsujino | |

FOREIGN PATENT DOCUMENTS

| | | |
|---|---|---|
| JP | 05-183065 A | 7/1993 |
| JP | 08-111467 A | 4/1996 |
| JP | 2003-046180 A | 2/2003 |
| JP | 2012-222079 A | 11/2012 |
| WO | 2009/096542 A1 | 8/2009 |

* cited by examiner

PACKAGE FOR HOUSING SEMICONDUCTOR ELEMENT AND SEMICONDUCTOR DEVICE

TECHNICAL FIELD

The present invention relates to a package for housing a semiconductor element configured to house a semiconductor element, and a semiconductor device using the same, and, more specifically, a semiconductor element housing package having features in an input/output terminal section to be used for a signal input/output section, and a semiconductor device.

BACKGROUND ART

A package for housing a semiconductor element (hereinafter, simply referred to as "package") which airtightly houses the semiconductor element of the related art is illustrated in FIG. 4 (for example, see Patent Literature 1).

The package of the related art includes a base body 101 that is a main portion. The base body 101, which is made of a metal such as a copper (Cu)-tungsten (W) alloy, has a substantially rectangular shape. Furthermore, a frame body 102, which is made of an iron (Fe)-nickel (Ni)-cobalt (Co) alloy or the like, is bonded to an upper surface of the base body 101.

The frame body 102 is bonded to the upper surface of the base body 101 via a brazing material. The frame body 102 includes attaching sections 102d for fitting input/output terminals 103 to both side portions thereof. The input/output terminal 103 is bonded to the attaching section 102d via a brazing material.

The input/output terminal 103 has a rectangular plate section 103a made of alumina ($Al_2O_3$) ceramics. On an upper surface of the plate section 103a is formed a line conductor 104 made of a metalized layer such as tungsten (W) and molybdenum (Mo), the line conductor extending from one side to another side facing one side. Then, a vertical wall section 103b made of alumina ceramics is fixed to the upper surface of the plate section 103a so that the line conductor 104 are sandwiched between the plate section 103a and the vertical wall section 103b. Four reinforcement sections 103c extending from both-side end surfaces of the vertical wall section 103b to ends of the plate section 103a are formed in the input/output terminal 103.

Then, a field effect transistor and the like are housed in a space defined inside the frame body 102 and each electrode of the field effect transistor and the like, and the line conductor 104 are connected with a bonding wire and the like. Then, a lid body 106 is bonded to an upper surface of the frame body 102 via a seal ring 105. As described above, the semiconductor device in which the field effect transistor and the like are airtightly sealed inside the package is obtained.

Heat is generated when operating the field effect transistor and the like. Each portion of the package is subjected to thermal expansion, and the package is deflected by the heat of the field effect transistor and the like. However, since both ends of the input/output terminal 103 are reinforced by the reinforcement sections 103c, cracking is less prone to occur in the both ends of the input/output terminal 103. Since cracking is less prone to occur in the input/output terminal 103, airtightness of the package is maintained.

CITATION LIST

Patent Literature

Patent Literature 1: Japanese Unexamined Utility Model Registration Publication JP-U 5-11443 (1993)

SUMMARY OF INVENTION

Technical Problem

However, in the package for housing a semiconductor element of the related art using the input/output terminal 103 illustrated in Patent Literature 1, in a case where warpage occurs in the base body 101, when applying a force for correcting the warpage, the greatest stress is generated near a vertex of the warpage of the base body 101, and in many cases, in the vicinity of the center of the base body 101. In addition, the stress is also generated in the frame body 102. Thus, there is a problem that cracking occurs in the input/output terminal 103 positioned in the vicinity of the center of the frame body 102 and the inside of the package for housing a semiconductor element that cannot be airtightly maintained.

Furthermore, as the line conductors 104 formed in the input/output terminal 103 are in high density and a distance between the line conductors 104 is reduced, the line conductors 104 are prone to be short-circuited by a foreign matter and the like between the line conductors 104.

Thus, the invention is made in view of the problems described above, and an object of the invention is to maintain airtightness of a package for housing a semiconductor element.

Solution to Problem

A package for housing a semiconductor element according to an embodiment of the invention includes: a base body comprising a bottom plate section and a side wall section having a frame shape; and an input/output terminal provided so as to pass through the side wall section, the input/output terminal having a plate section made of ceramics on which line conductors are formed, and a vertical wall section which is made of ceramics and is fixed to the plate section so as to continue to the side wall section and so that the line conductors are sandwiched between the plate section and the vertical wall section and both ends of the line conductors are exposed from the vertical wall section, the vertical wall section of the input/output terminal having a thick section in a center portion of a side surface of the vertical wall section in a direction along the side wall section, the thick section having thick wall thickness, a lower end of the thick section being fixed to the plate section.

In the package for housing a semiconductor element, it is preferable that a curved surface section is provided in a corner section of the vertical wall section fixed to the plate section.

Furthermore, it is preferable that a curved surface section is provided from the side surface of the vertical wall section to a side surface of the thick section.

Furthermore, it is preferable that the thick section is provided only on the side surface of the vertical wall section positioned inside the side wall section.

Furthermore, it is preferable that the thick section is disposed so as to be positioned at a center of one side of the side wall section.

A semiconductor device according to an embodiment of the invention includes: the above-mentioned package for housing a semiconductor element; and a semiconductor element accommodated in a concave section surrounded by the bottom plate section and the side wall section, the semiconductor element being electrically connected to the input/output terminal.

Advantageous Effects of Invention

In the package for housing a semiconductor element according to an embodiment of the invention, the vertical wall section of the input/output terminal has the thick section in the center portion of the side surface of the vertical wall section in the direction along the side wall section, the thick section having thick wall thickness, the lower end of the thick section being fixed to the plate section. Thus, cracking is less prone to occur in the vicinity of the center portion of the input/output terminal, and the inside of the package for housing a semiconductor element can be airtightly maintained.

Furthermore, when the curved surface section is provided in the corner section of the vertical wall section fixed to the plate section, cracking is less prone to occur in the corner section. Simultaneously, since the curved surface section is disposed in the corner section, a plating solution is less prone to remain in the corner section when a plating process is performed in the line conductors. Thus, occurrence of a metallic foreign matter due to a remaining plating solution is suppressed and short-circuiting between adjacent line conductors can be prevented.

Furthermore, when the curved surface section is provided from the side surface of the vertical wall section to the side surface of the thick section, a portion of the thick section toward the vertical wall section side can be widened and the vertical wall section can be reinforced. Furthermore, because of the curved surface, the curved surface section is less prone to become a starting point of cracking. Furthermore, the foreign matter generated by remaining the plating solution can be suppressed in the corner section between the thick section and the vertical wall section. Accordingly, cracking is less prone to occur, and short-circuiting between adjacent line conductors due to the generation of the foreign matter can be prevented.

Furthermore, when the thick section is provided only on the side surface of the vertical wall section positioned inside the side wall section, since the plate section outside of the side wall section is not narrowed by the presence of the thick section, it is not necessary to narrow a width and a gap of the line conductor on the outside of the side wall section. Thus, the short-circuiting between the line conductors is less prone to occur, and it is possible to satisfactorily transmit an electrical signal.

Furthermore, when the thick section is disposed so as to be positioned at the center of one side of the side wall section, a crack is less prone to be developed in the input/output terminal in the vicinity of the center of one side of the side wall section in which the greatest stress is prone to be generated when screwing.

The semiconductor device according to an embodiment of the invention includes the above-mentioned package for housing a semiconductor element and the semiconductor element accommodated in the concave section surrounded by the bottom plate section and the side wall section, the semiconductor element being electrically connected to the input/output terminal. Thus, the semiconductor device has high airtightness and high reliability of electrical connection of the input/output terminal.

DESCRIPTION OF EMBODIMENTS

Figure 1:
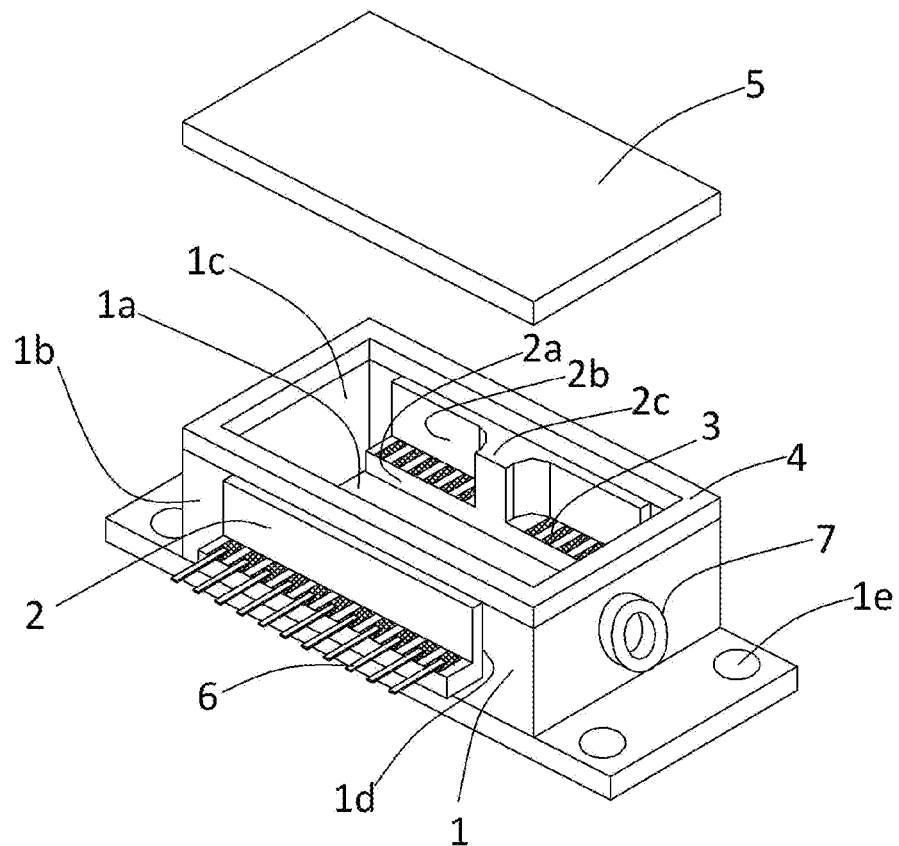
FIG. 1 is a perspective view illustrating an example of an embodiment of a package for housing a semiconductor element of the invention.

In FIG. 1, a perspective view of a package for housing a semiconductor element according to an embodiment of the invention is illustrated. Furthermore, FIGS. 2A, 2B, 2C, 3A and 3B are perspective views illustrating each example of embodiments of an input/output terminal used for the package for housing a semiconductor element. FIG. 1 illustrates a case of the package for housing a semiconductor element (hereinafter, also referred to as optical package) configured to house an optical semiconductor element such as LD (semiconductor laser) or PD (a photodiode) as an example.

In these drawings, reference numeral 1a denotes a bottom plate section, and reference numeral 1b denotes a frame-shaped side wall section. A base body 1 is composed of the bottom plate section 1a and the side wall section 1b. A concave section 1c is defined by an inner space surrounded by the bottom plate section 1a and the side wall section 1b. Then, the semiconductor element and the like are accommodated in the concave section 1c.

Reference numeral 2 denotes an input/output terminal. The input/output terminal 2 is fitted into a through hole 1d provided so as to pass through the inside and outside of the side wall section 1b. Moreover, reference numeral 4 denotes a seal ring, reference numeral 5 denotes a lid body being fixed to the seal ring 4, and reference numeral 7 denotes a cylindrical fixing member configured to fix a metal holder (not illustrated) to which an optical fiber (not illustrated) is attached.

The optical package which accommodates the optical semiconductor element such as LD or PD as the semiconductor element thereinside is configured by the base body 1, the input/output terminal 2, the seal ring 4, and the fixing member 7. Furthermore, by mounting an optical semiconductor device and then attaching the lid body 5 to the upper surface of the seal ring 4, the optical semiconductor device which airtightly seals the optical semiconductor element is completed.

The bottom plate section 1a has, on an upper surface thereof, a placement section for placing the semiconductor element. The bottom plate section 1a functions as a support member for supporting the semiconductor element and has a function of radiating heat generated when operating the semiconductor element to the outside. Furthermore, the bottom plate section 1a has screw holes 1e on the outside of the side wall section 1b. The semiconductor device is screwed to an external electrical circuit board through the screw holes 1e.

The bottom plate section 1a has a substantially rectangular shape and is formed of a metal such as an Fe—Ni—Co alloy or a Cu—W alloy. Furthermore, the bottom plate section 1a is shaped into a predetermined form by applying a metal process such as rolling or pressing to an ingot such as the Fe—Ni—Co alloy.

Moreover, on the surface of the bottom plate section 1a, metals may be plated for having excellent corrosion resistance and excellent wettability with a brazing material, more specifically, an Ni layer having a thickness of 0.5 to 9 µm and an Au layer having a thickness of 0.5 to 5 µm may be sequentially deposited with a plating method. The plating prevents oxidation corrosion of the bottom plate section 1a. Furthermore, the plating can make the semiconductor element and the like be firmly bonded and fixed to the upper surface of the bottom plate section 1a.

Furthermore, to the upper surface of the bottom plate section 1a, the side wall section 1b which is formed of a metal such as the Fe—Ni—Co alloy and which has a substantially rectangular shape in a plan view thereof is bonded through the brazing material such as an Ag solder so as to surround the placement section for the semiconductor element. The side wall section 1b has attaching sections 1d formed of a through hole or a notch for fitting the input/output terminal 2 thereinto in both side portions of a long side. As illustrated in FIG. 1, in addition to a case where the attaching section 1d is formed of the notch communicating with the inside and outside of the side wall section 1b by cutting away an upper portion of the side wall section 1b, the attaching section 1d may be formed by a notch formed by cutting away a lower portion of the side wall section 1b or may be formed by a through hole passing through the center of the side surface of the side wall section 1b.

The side wall section 1b is shaped into a predetermined form by applying a metal process such as rolling or pressing to an ingot such as the same alloy as that of the bottom plate section 1a. Moreover, here, a method for forming the base body 1 by bonding the bottom plate section 1a and the side wall section 1b is illustrated, but the bottom plate section 1a and the side wall section 1b may be integrally machined.

Bonding of the side wall section 1b to the bottom plate section 1a is performed by melting the brazing material such as a preform-shaped Ag solder laid between the upper surface of the bottom plate section 1a and the lower surface of the side wall section 1b and thereafter cooling and solidifying the brazing material. Furthermore, similar to the bottom plate section 1a, on the surface of the side wall section 1b, metal layers such as the Ni layer having a thickness of 0.5 to 9 µm and the Au layer having a thickness of 0.5 to 5 µm may be deposited with a plating method.

The input/output terminal 2 having a function for blocking breathability of the inside and outside of the optical package is bonded to the attaching section 1d of the side wall section 1b by the brazing material such as an Ag solder. The input/output terminal 2 has a function of performing input and output of a high-frequency signal between the semiconductor element and the external electrical circuit.

The input/output terminal 2 has line conductors 3 that are formed by a metalized layer such as W, Mo, and manganese (Mn) from one long side of the upper surface of a plate section 2a formed of a rectangular dielectric substance to the other long side thereof. Furthermore, a vertical wall section 2b formed of a rectangular columnar dielectric substance is laminated in a substantially center portion in a direction of a short side of the plate section 2a on the upper surface of the plate section 2a along a longitudinal direction (a direction in which the vertical wall section 2b is attached along the side wall section 1b) so that a part of the line conductors 3 is sandwiched between the plate section 2a and the vertical wall section 2b. Both ends of the line conductors 3 are exposed to the outside of the vertical wall section 2b.

For example, the line conductor 3 is formed by applying a metal paste obtained by admixing an organic solvent and a solvent to powders of W, Mo, Mn or the like, to a ceramic green sheet for the plate section 2a with a predetermined pattern using a conventional well-known screen printing method and by firing the metal paste. The line conductors 3 are denoted by cross-hatching lines in the FIGS. for clarity. These cross-hatching lines are not intended to indicate a cross section.

The plate section 2a and the vertical wall section 2b are formed of a dielectric body such as $Al_2O_3$ ceramics, AlN ceramics, and $3Al_2O_3.2SiO_2$ ceramics. Moreover, a metalized layer similar to the line conductors 3 is formed on the brazing portion in an outer peripheral surface of the plate section 2a and the vertical wall section 2b to braze the attaching section 1d.

The vertical wall section 2b has a thick section 2c having thicker than the wall thickness and formed in the central portion in the longitudinal direction thereof. The thick section 2c is formed so as to extend to a lower end of the vertical wall section 2b, and the lower end of the thick section 2c is integrated to the upper surface of the plate section 2a together with the lower end of the vertical wall section 2b. An upper end of the thick section 2c may be formed to an upper end of the vertical wall section 2b, but may not be necessarily formed to the upper end.

Thus, since the thick section 2c is provided in the center portion of the input/output terminal 2 in the longitudinal direction thereof, the center portion of the vertical wall section 2b is increased in thickness and is reinforced. Even when strain occurs when screwing, a cracking in the vicinity of the center portion of the input/output terminal 2 is prevented, thus a function of airtightly holding the inside of the package is performed.

Figure 2A:
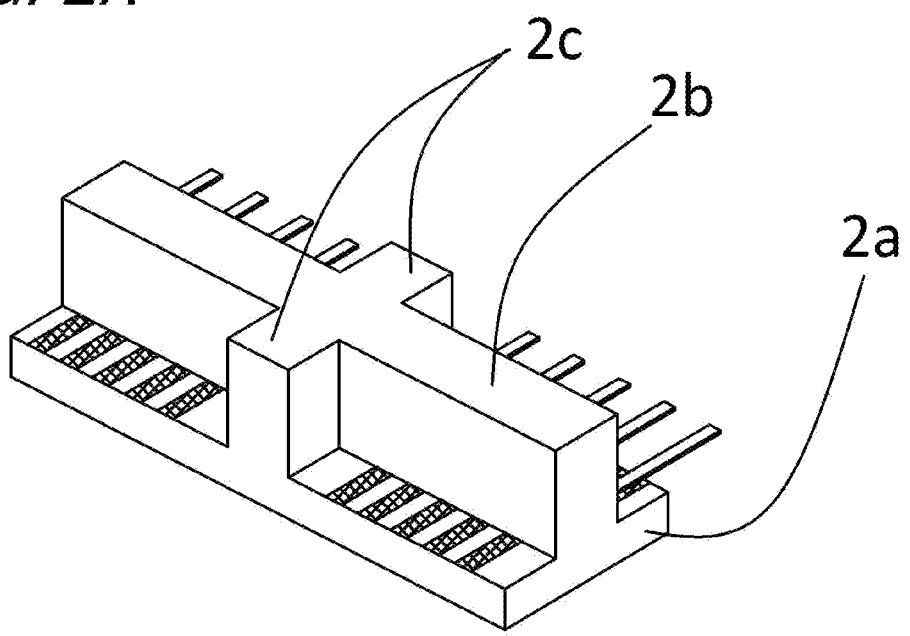
FIG. 2A is a perspective view illustrating an example of an embodiment of an input/output terminal of the package for housing a semiconductor element of FIG. 1.
Figure 2B:
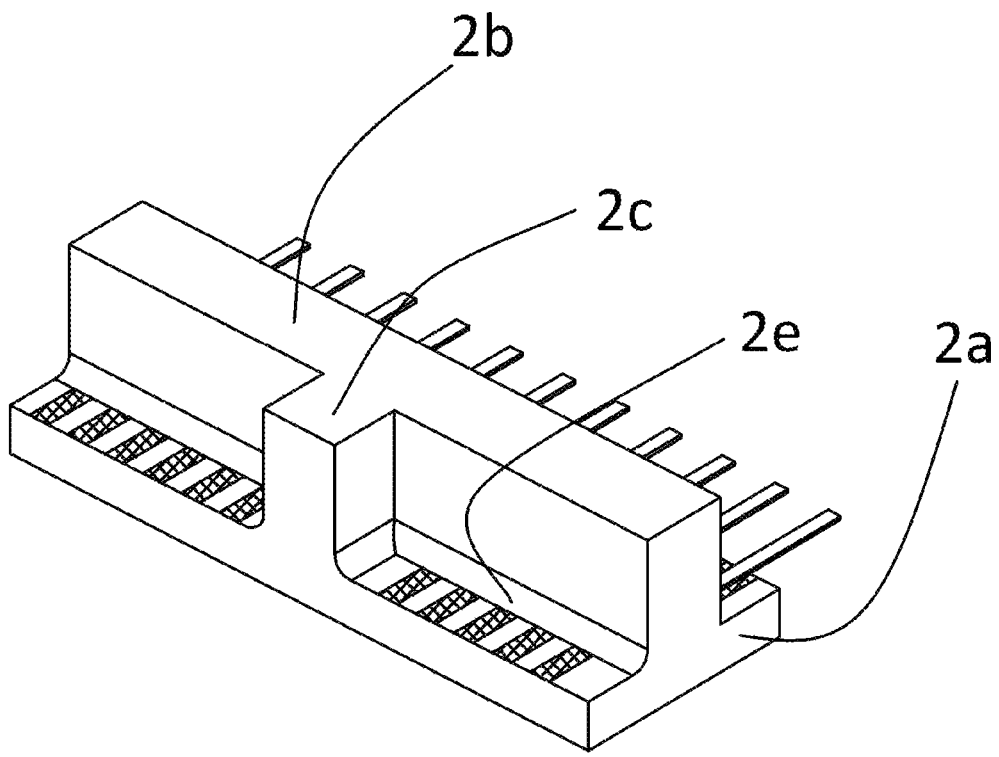
FIG. 2B is a perspective view illustrating another example of the embodiment of the input/output terminal of the package for housing a semiconductor element of FIG. 1.
Figure 2C:
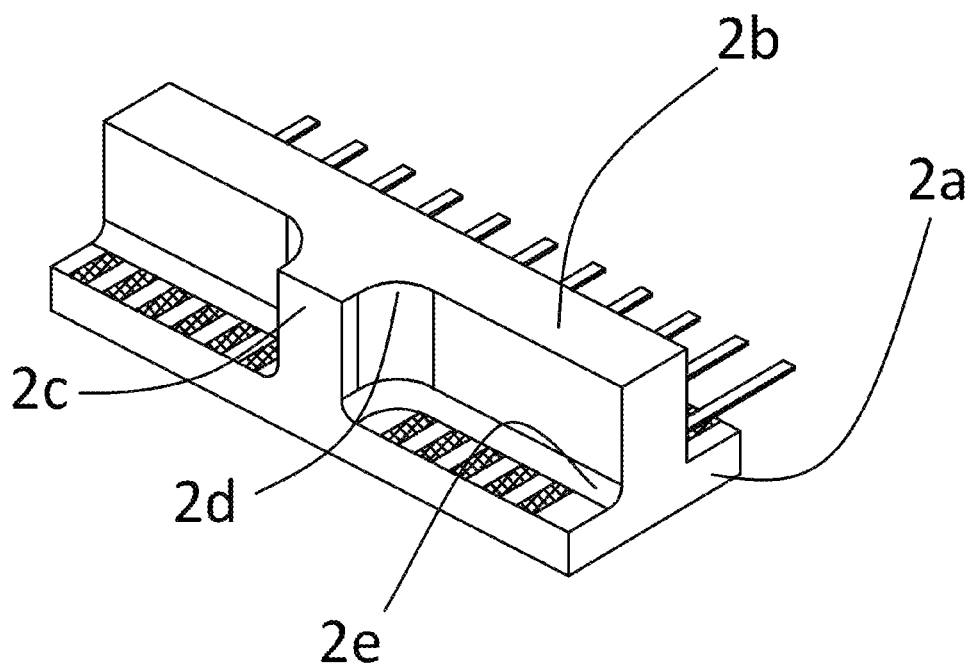
FIG. 2C is a perspective view illustrating another example of the embodiment of the input/output terminal of the package for housing a semiconductor element of FIG. 1.

For example, as illustrated in FIGS. 2A, 2B and 2C, the thick section 2c can be provided in various forms.

FIG. 2A illustrates an example in which the thick sections 2c are provided on both sides of the inside and the outside of the vertical wall section 2b.

FIG. 2B illustrates an example in which the thick section 2c is provided only on the inside of the vertical wall section 2b that is the inside of the package. Furthermore, FIG. 2B illustrates the example in which a curved surface section 2e is formed in the lower end of the vertical wall section 2b fixed to the plate section 2a.

FIG. 2C illustrates an example in which the thick section 2c is provided only on the inside of the vertical wall section 2b and a curved surface section 2d is formed from a side surface of the thick section 2c to a side surface of the vertical wall section 2b. Moreover, the curved surface section 2e is also formed in the lower end of the vertical wall section 2b fixed to the plate section 2a.

When the curved surface section 2d is formed from the side surface of the thick section 2c to the side surface of the vertical wall section 2b, a portion of the thick section 2c toward the side of the vertical wall section 2b is widened and the vertical wall section 2b is enhanced in strength. Furthermore, since an angular section between the thick section 2c and the vertical wall section 2b is eliminated and a plating solution is less prone to remain after plating, occurrence of the foreign matter generated by the remaining plating solution can be suppressed. Furthermore, because of the curved surface, the curved surface section is less prone to become a starting point of the crack. Accordingly, the curved surface section 2d makes cracking less prone to occur in the input/output terminal 2, and short-circuiting due to the foreign matter between adjacent line conductors 3 can be prevented.

Further, when the thick section 2c is provided only on the inside of the vertical wall section 2b, the plate section 2a on the outside of the side wall section 1b is not narrowed due to the presence of the thick section 2c. Thus, a degree of freedom of an arrangement such as the width and gap of the line conductors 3 is increased on the outside of the side wall section 1b, and the short-circuiting between the line conductors 3 is less prone to occur. Furthermore, it is possible to satisfactorily transmit an electrical signal to the line conductor 3.

In addition, the curved surface section 2e may be formed in the corner section made between the lower end of the vertical wall section 2b and the plate section 2a, the lower end of the vertical wall section 2b being a portion in which the vertical wall section 2b and/or the thick section 2c that is a part of the vertical wall section 2b comes into contact with the plate section 2a. The curved surface sections 2e can be formed by applying a paste-like ceramic slurry (a mixture of ceramic materials having a low viscosity) to the corner section of the input/output terminal 2 before firing.

Since such a curved surface section 2e is formed, cracking is less prone to occur in the corner section and the plating solution is less prone to remain in the corner section when performing the plating process in the line conductors 3. Thus, occurrence of the metallic foreign matter due to the remaining plating solution is suppressed and the short-circuiting between adjacent line conductors 3 can be prevented.

Figure 3A:
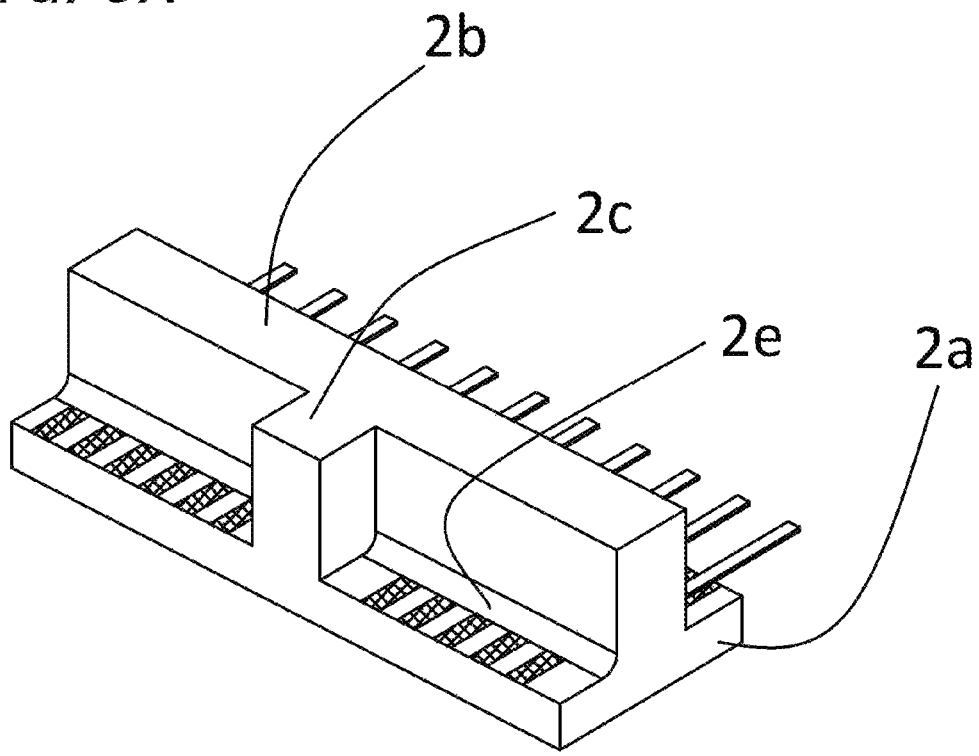
FIG. 3A is a perspective view illustrating an example of another embodiment of an input/output terminal.

As illustrated in FIGS. 2A, 2B and 2C, the curved surface section 2e provided in the corner section may be formed in the corner section of the vertical wall section 2b including the thick section 2c fixed to the plate section 2a. In addition, as illustrated in FIG. 3A, the curved surface section 2e may be formed in the corner section of the vertical wall section 2b fixed to the plate section 2a except for the thick section 2c. It is possible to achieve the object described above even by the curved surface section 2e as illustrated in FIG. 3A.

Figure 3B:
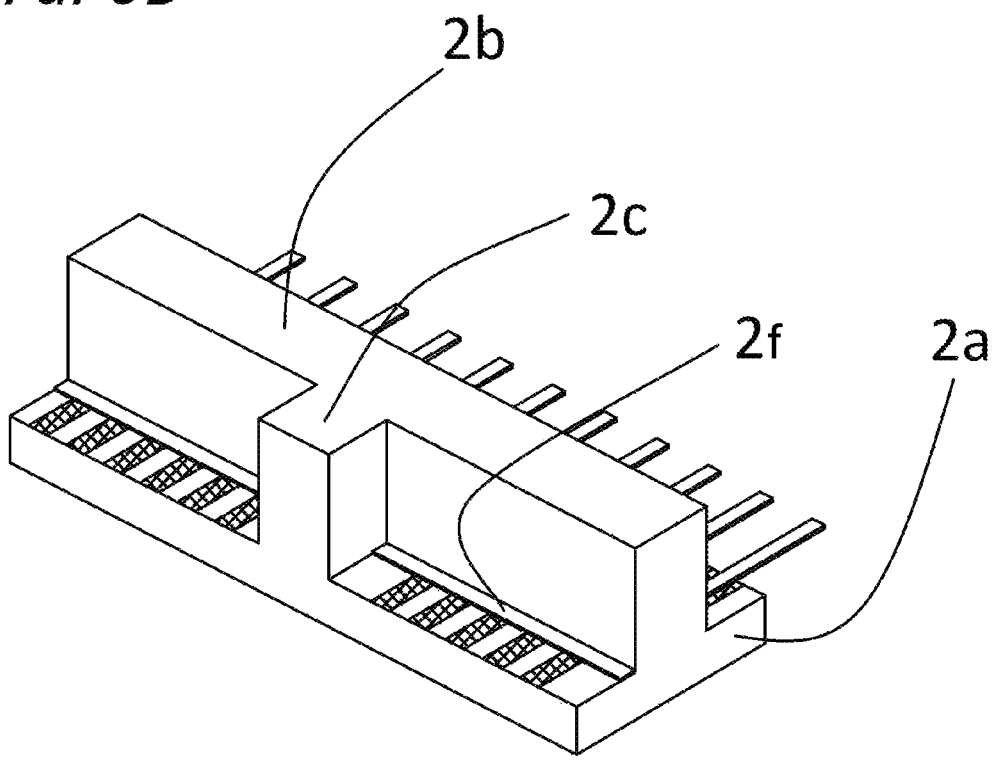
FIG. 3B is a perspective view illustrating an example of another embodiment of an input/output terminal.
Figure 4:
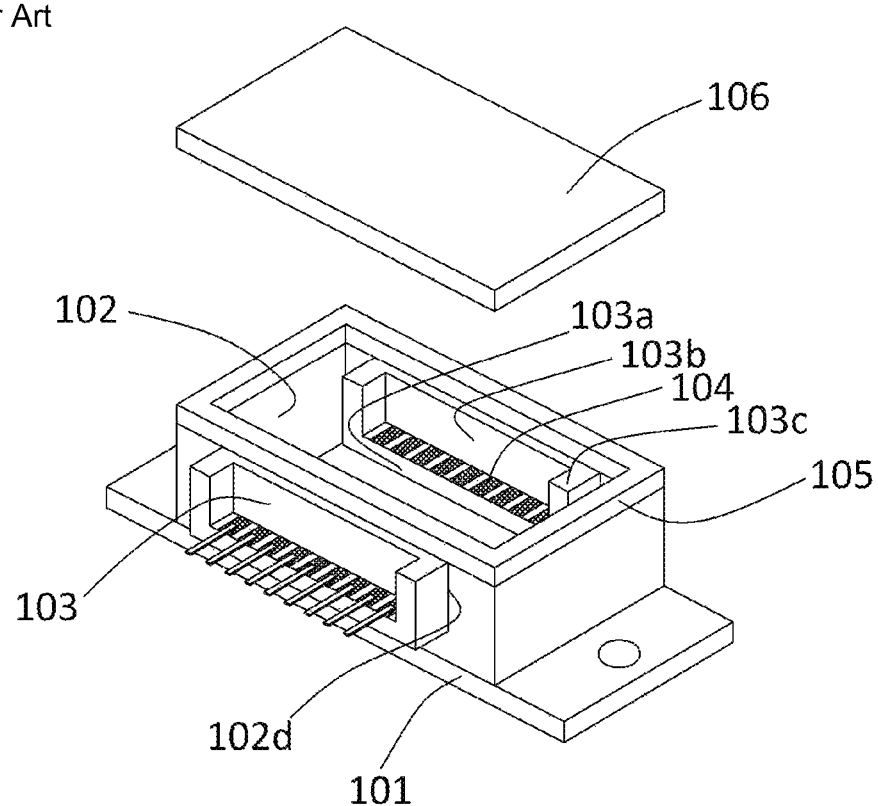
FIG. 4 is a perspective view illustrating an example of a package for housing a semiconductor element of the related art.

Furthermore, as illustrated in FIG. 3B, for the purpose of preventing the short-circuiting due to the metallic foreign matter, a ceramic film 2f which covers the line conductors 3 in the corner section may be formed.

Furthermore, the thick section 2c may be disposed so as to be positioned at the center of the side wall section 1b in the longitudinal direction thereof. For example, as illustrated in FIG. 1, in a case where the input/output terminal 2 is attached to the center of the side wall section 1b in the long side, the thick section 2c is formed in the center position of the input/output terminal 2 and is disposed so as to be positioned at the center of the long side of the side wall section 1b. Furthermore, in a case where the input/output terminal 2 is attached to a position slightly deviated from the center of the long side, the thick section 2c is formed at the position slightly deviated from the center of the input/output terminal 2 so as to be positioned at the center of the long side.

As described above, since the thick section 2c is disposed so as to be positioned at the center of the side wall section 1b, a crack can be less prone to be developed in the input/output terminal 2 in the vicinity of the center of the side wall section 1b in which the greatest stress is prone to occur and then cracking is prone to occur.

As a result, damage such as cracking is less prone to occur in the input/output terminal 2, and it is possible to make the package having a good airtight sealing property of the inside of the package. Furthermore, it is possible to make the package in which the high-frequency signal can be satisfactorily transmitted through the line conductors 3. Furthermore, it is possible to make the package in which the semiconductor element housed inside the package is normally and stably operated.

A lead terminal 6 which is formed of a metal such as Fe—Ni—Co alloy and is configured to transmit the high-frequency signal between the external electrical circuit and the input/output terminal 2, is bonded to a portion of the line conductor 3 located outside the side wall section 1b with the brazing material such as an Ag solder.

Furthermore, in a case where the package of the invention is used as the optical package, a through hole is formed in one side portion on the short side of the side wall section 1b, and one end of the cylindrical fixing member 7 is bonded to the periphery of an outside opening of the through hole with the brazing material such as an Ag solder. A metal holder (not illustrated) to which an optical fiber (not illustrated) is attached with an adhesive such as a resin, is bonded to the other end surface of the fixing member 7 with the brazing material having a low melting point such as Au—Sn. The fixing member 7 is produced by processing the same metal as the bottom plate section 1a or the side wall section 1b into a predetermined shape with the same processing method. On the surface of the fixing member 7, metal layers such as a Ni layer having a thickness of 0.5 to 9 μm and an Au layer having a thickness of 0.5 to 5 μm may be deposited with a plating method.

The seal ring 4 is bonded to the upper surface of the side wall section 1b to which the input/output terminal 2 and the fixing member 7 are attached with the brazing material such as an Ag solder. The seal ring 4 is bonded to the upper surface of the side wall section 1b with the brazing material such as an Ag solder to sandwich the input/output terminal 2, and functions as a bonding medium for bonding the lid body 5 for sealing the semiconductor element to the upper surface of the seal ring by seam welding or otherwise. Moreover, use of the seal ring 4 may be omitted.

The semiconductor element is placed and fixed to the concave section 1c of the optical package with a brazing material having a low melting point such as an Sn—Pb solder, the line conductors 3 of the input/output terminal 2 and the electrode of the semiconductor element are electrically connected with a bonding wire or the like, and the metal holder to which the optical fiber is attached with an adhesive such as a resin, is bonded to the fixing member 7 with the brazing material having the low melting point such as Au—Sn, and then the lid body 5 is bonded to the upper surface of the seal ring 4 so as to cover the concave section 1c with a seam weld and the like. Thus, the semiconductor device is completed as a product.

The semiconductor device is screwed to the external electronic circuit board, and then the optical semiconductor element is optically excited by a driving signal supplied from the external electronic circuit, and light such as excited laser beams is received and transmitted through the optical fiber. Thus, the semiconductor device functions as a photoelectric conversion device capable of transmitting a large volume of information at high speed. Such a semiconductor device is often used in a field of optical communication or the like.

Thus, the semiconductor device can seal the semiconductor element that is driven by a high-frequency signal or the optical signal, operable in normal and stable for a long time.

Moreover, the invention is not limited to the above embodiments and examples, and various modifications are possible without departing from the scope of the invention. For example, in the above embodiments, the optical package is described as an example, but the semiconductor element is not limited to the optical semiconductor element and can also be applied to an electronic component such as a light emitting element (LED), a field effect transistor (FET), an integrated circuit element (IC), a capacitor, or a piezoelectric element.

Furthermore, a case where the shape of the bottom plate section 1a and the side wall section 1b in a plan view thereof is a rectangle is illustrated, but the invention is not limited to this, and the shape of the bottom plate section 1a and the side wall section 1b in a plan view thereof may be hexagonal, octagonal, oval or the like, and a variety of shapes can be adopted.

The base body 1 in which the side wall section 1b is bonded to the upper surface of the bottom plate section 1a is illustrated as an example, but the bottom plate section 1a and the side wall section 1b may be integrally formed by press molding or otherwise to obtain the base body 1.

REFERENCE SIGNS LIST

1: Base body
1a: Bottom plate section
1b: Side wall section
1c: Concave section
1d: Attaching section
1e: Screw hole
2: Input/output terminal
2a: Plate section
2b: Vertical wall section
2c: Thick section
2d: Curved surface section (side surface)
2e: Curved surface section (lower end corner section)
3: Line conductor
4: Seal ring
5: Lid body

The invention claimed is:

1. A package for housing a semiconductor element, comprising:
    a base body comprising a bottom plate section and a side wall section having a frame shape; and
    an input/output terminal provided so as to pass through the side wall section, the input/output terminal having a plate section made of ceramics on which line conductors are formed, and a vertical wall section which is made of ceramics and is fixed to the plate section so as to continue to the side wall section and so that the line conductors are sandwiched between the plate section and the vertical wall section and both ends of the line conductors are exposed from the vertical wall section,
    the vertical wall section of the input/output terminal having a thick section in a center portion of each of a plurality of side surfaces of the vertical wall section in a direction along the side wall section, the plurality of side surfaces being positioned inside and outside the side wall section, the thick section having thick wall thickness, a lower end of the thick section being fixed to the plate section, and
    wherein the thick section projects from the vertical wall section of the input/output terminal and an end surface of the thick section in a thickness direction thereof extends to an end surface of the plate section, and
    the line conductors are not covered with the thick section.

2. The package for housing a semiconductor element according to claim 1,
    wherein a curved surface section is provided in a corner section of the vertical wall section fixed to the plate section.

3. The package for housing a semiconductor element according to claim 1,
    wherein a concave curved surface section is provided from the side surface of the vertical wall section to a side surface of the thick section.

4. The package for housing a semiconductor element according to claim 1,
    wherein the thick section is disposed so as to be positioned at a center of one side of the side wall section.

5. A semiconductor device, comprising:
    the package for housing a semiconductor element according to claim 1; and
    a semiconductor element accommodated in a concave section surrounded by the bottom plate section and the side wall section, the semiconductor element being electrically connected to the input/output terminal.

* * * * *